United States Patent
Schroen et al.

(10) Patent No.: US 6,303,977 B1
(45) Date of Patent: Oct. 16, 2001

(54) FULLY HERMETIC SEMICONDUCTOR CHIP, INCLUDING SEALED EDGE SIDES

(75) Inventors: Walter H. Schroen; Judith S. Archer, both of Dallas; Robert E. Terrill, Houston, all of TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/453,135

(22) Filed: Dec. 2, 1999

Related U.S. Application Data

(60) Provisional application No. 60/110,837, filed on Dec. 3, 1998.

(51) Int. Cl.[7] ................................................. H01L 29/80
(52) U.S. Cl. ................ 257/635; 257/760; 257/702; 257/701; 257/758; 257/723; 257/620; 257/644; 257/788; 257/791; 257/792; 257/784; 257/786
(58) Field of Search .................................. 257/678, 700, 257/701, 758, 723, 730, 787, 786, 784, 774, 788, 791, 792, 768, 769, 760, 762, 773, 759, 668, 620, 632, 635, 644

(56) References Cited

U.S. PATENT DOCUMENTS

| | | | |
|---|---|---|---|
| 5,430,329 | * | 7/1995 | Harada et al. ..................... 257/786 |
| 5,523,626 | * | 6/1996 | Hayashi et al. ..................... 257/763 |
| 5,847,466 | * | 12/1998 | Ito et al. ............................ 257/758 |
| 5,900,668 | * | 5/1999 | Wollesen ........................... 257/522 |
| 5,903,044 | * | 5/1999 | Farnworth et al. ................. 257/620 |
| 5,986,299 | * | 11/1999 | Nakamura et al. ................. 257/296 |
| 5,986,343 | * | 11/1999 | Chittipeddi et al. ................ 257/758 |
| 6,022,791 | * | 2/2000 | Cook et al. ......................... 438/458 |
| 6,031,293 | * | 2/2000 | Hsuan et al. ....................... 257/786 |
| 6,078,100 | * | 6/2000 | Duesman et al. .................. 257/690 |
| 6,090,633 | * | 7/2000 | Yu et al. ............................ 257/686 |

* cited by examiner

*Primary Examiner*—Alexander O. Williams
(74) *Attorney, Agent, or Firm*—Gary C. Honeycutt; Fred Telecky; Arthur I. Navarro

(57) ABSTRACT

A structure and method for forming a hermetically sealed semiconductor chip having an active and a passive surface and four edge sides, each edge side having only a single plane; said active surface having an integrated circuit including multiple deposited layers and a plurality of contact pads, said contact pads having bondable and non-corrodible surface; said deposited layers having exposed portions at said side edges; a protective overcoat impermeable to moisture overlying said integrated circuit; and a continuous sealant layer impermeable to moisture overlying all area of said four side edges, whereby said edge sides are sealed and said chip is rendered hermetic. Positioning a plurality of said chips on a support in a deposition apparatus and preferably using chemical vapor deposition or sputtering techniques, a layer, or a sandwich of layers, of moisture-impermeable material is deposited on all edge sides simultaneously while preventing deposition of said material on at least portion of the exposed active or passive surfaces.

12 Claims, 2 Drawing Sheets

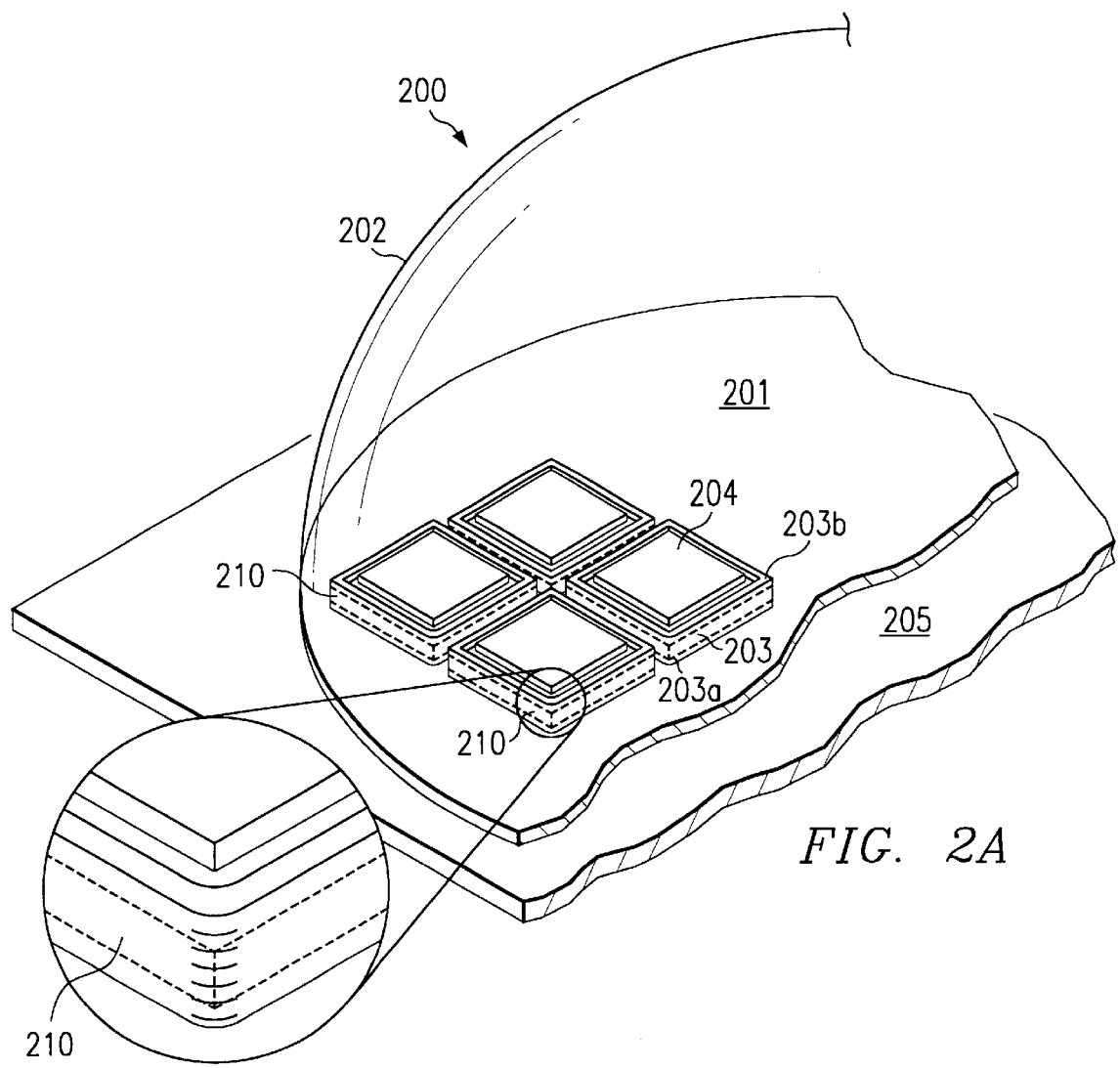
*FIG. 2A*
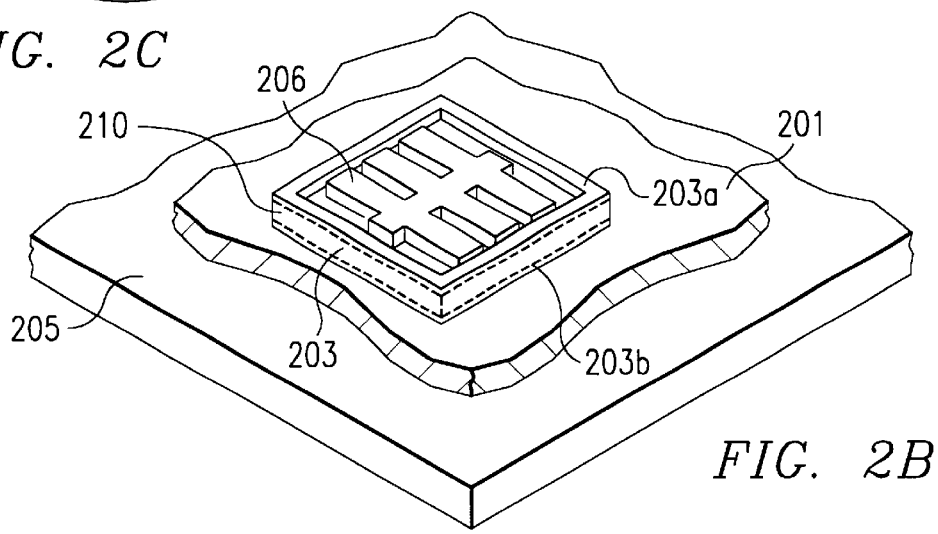
*FIG. 2C*
*FIG. 2B*

FULLY HERMETIC SEMICONDUCTOR CHIP, INCLUDING SEALED EDGE SIDES

This application claims priority under 35 USC § 119 based upon Provisional Patent Application No. 60/110,837, filed Dec. 3, 1998.

FIELD OF THE INVENTION

The present invention is related in general to the field of semiconductor devices and processes, and more specifically to a method for fabricating hermetic semiconductor chips.

DESCRIPTION OF THE RELATED ART

More than two decades ago, a process was developed to deposit a continuous layer of silicon nitride over the whole surface of a semiconductor wafer having a multitude of integrated circuit fabricated in it. Silicon nitride is not penetrated by water molecules (in contrast to silicon dioxide previously used as layer material), so that whenever a layer of silicon nitride is fabricated free of pinholes, it should protect the integrated circuits against moisture.

Following the silicon nitride layer deposition, however, the uniformity of this layer has to be interrupted by two unavoidable process steps: First, windows have to be etched through the overcoat to expose the metallization of the contact pads in order to enable wire bonding during the assembly process; consequently, this metallization, conventionally aluminum or copper, is exposed to potential degradation by moisture (corrosion). Second, the overcoat has to be cut apart in the sawing process which singulates the chips from the wafer; consequently, the edge sides of the chips are exposed and remain unprotected against potential penetration by moisture.

In order to operate semiconductor chips reliably in a moisture-proof environment, they are conventionally assembled in a package made of ceramic material, which is impermeable to moisture. Unfortunately, these hermetic packages are considerably more expensive than commercial plastic molded packages, which allow water molecules to penetrate through the plastic material (in standard pressure cooker testing, the first water molecules reach the chip inside after about 1 hour). Consequently, significant effort has been directed in the last few years to develop methods of protecting the contact pad aluminum after wire bonding or solder bumping so that the chips would be "hermetic" even in a plastic package. Particularly noteworthy is the "ChipSeal™ Process" by the Dow Corning Corporation, Midland, Mich., USA; see for example M. J. Loboda, "Safe Processes for Hard Dielectric Coatings: Growth of Silicon-Carbon Alloy Films from Organosilicon Gases", Proc. 124th Minerals, Metals & Materials Soc. (TMS) Ann. Meet., pp. 281–290, 1995; M. J. Loboda et al., "Chip Scale Packaging with High Reliability for MCM Applications", Intl. J. Microcircuits and El. Packaging, pp. 428–433, 1997. In this technology, silicon carbon alloy thin films are deposited by chemical vapor deposition techniques using gas mixtures of SiH4 and hydrocarbons, or alternatively organosilicon molecules. Properly engineered SiC films offer hermetic-like performance when used to protect surfaces from mechanical abrasion and corrosion. This technology has been successfully applied to protect bonding pads in silicon BiCMOS devices.

An alternative, metallurgical method of protecting the aluminum metallization of the contact pads against corrosion has been developed during the last three decades. In this method, the window in the dielectric protective overcoat (usually silicon nitride) is first opened to expose the metallization (usually aluminum or aluminum alloy) of the contact pad. Next, a thin layer of refractory metal which adheres well to both the aluminum and the overcoat is deposited. Then, a thin layer of noble metal is deposited with the intention to deposit solder (by evaporation or plating) over it. Descriptions of this technology have been published in the IBM J. Res. Develop., vol. 13, pp. 226–296, 1969: P. A. Totta et al., "SLT Device Metallurgy and its Monolithic Extension"; L. F. Miller, "Controlled Collapse Reflow Chip Joining"; L. S. Goldmann, "Geometric Optimization of Controlled Collapse Interconnections"; K. C. Norris et al., "Reliability of Controlled Collapse Interconnections"; S. Oktay, "Parametric Study of Temperature Profiles in Chips Joined by Controlled Collapse Techniques"; B. S. Berry et al., "Studies of the SLT Chip Terminal Metallurgy".

These processes did not optimize the metallurgy for wire bonding (usually gold or copper) or for minimizing sensitivity to thermomechanical stress, especially in the protective overcoat. Further, the overall process is expensive, since at least ten process steps are involved.

In contrast to the metallurgical research, little effort has been made to protect the exposed edge sides of silicon integrated circuit chips. These edges sides have become increasingly more sensitive for microcracks unavoidably generated during the sawing process (length about 50 $\mu$m) and propagating from the sawing street sidewise into the silicon single crystal and the insulator layers. Moisture will follow the advancing cracks and start penetrating destructively the integrated circuit structures located next to the chip periphery. The reason for this recent upsurge in sensitivity is the ongoing cost-reducing trend of minimizing the silicon material reserved for the sawing lines; saw lines consume valuable silicon real estate and are therefore not useable for integrated circuit structures. As a matter of fact, the saw lines are shrunk so much in recent circuit designs and are thus positioned so close to the integrated circuit that sacrificial structures for arresting insulator cracks are now being proposed next to the sawing lines and fabricated in conjunction with the integrated circuit manufacturing processes (see, for instance, M. Ibnabdeljalil et al., U.S. patent application Ser. No. 60/073,939, filed Feb. 6, 1998). Even for the select few circuits types for which this approach has so far been proposed, the guaranteed reliability still has to be demonstrated.

A proposal to protect chip edges by a laser chemical vapor deposition technique is too expensive and too slow for mass production since this method processes the chips individually; see U.S. Pat. No. 5,451,550, issued on Sep. 19, 1995 (Wills et al., "Method of Laser CVD Seal a Die Edge").

In U.S. Pat. No. 5,300,461, issued Apr. 5, 1994 (Ting, "Process for Fabricating Sealed Semiconductor Chip using Silicon Nitride Passivation Film"), a structure and process are described to first isolate individual chips fabricated in a semiconductor wafer by etch steps, which expose, in a sloped contour, portions of the silicon surface and the plurality of layers deposited upon the silicon surface. Second, a thin (less than 100 nm, UV light transparent) silicon nitride layer is deposited over the complete circuit surface, its exposed edge sides, and the exposed silicon surface. Third, non-corrosive conductive material is deposited for protection over the bonding pads. Fourth, a sawing step singulates the individual chips. While this proposed method is aiming at mass production, it requires extra photomask steps and does not use standard bonding processes. Because of its thinness, the sealant layer is at risk for thin spots and pin holes. The combination of etching and sawing consumes more valuable silicon than desirable. In summary, the method is expensive and not compatible with the mainstream of semiconductor technology. In addition, when integrated circuit chips are to be assembled into stacks, which is especially advantageous in memory products, then the assembly process becomes complicated when the chip edge sides are sloped or not in one plane An urgent need has, therefore, arisen for a coherent approach to fabricating a hermetic semiconductor chip, consisting of a low-cost method of sealing the exposed edge sides after the singulation process, and a moisture-insensitive and low-stress protection of the contact pad metallization. The method should be flexible enough to be applied for different semiconductor product families and a wide spectrum of design and process variations, should provide assembly options for both wire bonding and solder connections, and should achieve improvements towards the goal of small outline and low profile packages—a persistent trend in today's semiconductor technology. Preferably, these innovations should be accomplished using the installed equipment base so that no investment in new manufacturing machines is needed.

SUMMARY OF THE INVENTION

The present invention provides methods of fabricating a hermetic semiconductor device comprising a chip having a moisture-impenetrable circuit overcoat, non-corrodible contact pad metallization, and mass-produced moisture-impenetrable layers over the edge sides. The invention particularly relates to high density, high speed integrated circuit chips which are intended for direct-chip attach onto substrates and printed motherboards. These integrated circuits can be found in many device families such as processors, digital and analog devices, certain memory and most logic devices, high frequency and high power devices, especially in large chip area categories. The invention helps to alleviate the space constraints in continually shrinking applications such as cellular communications, pagers, hard disk drives, laptop computers and medical instrumentation. Furthermore, the invention eliminates the need for expensive and complicated hermetically sealed packages. Consequently, cost, weight and size of the final semiconductor device are dramatically reduced. The invention supports the general trend of the semiconductor technology towards chip-size devices of low profile.

In accordance with the present invention, cost-effective mass fabrication methods for hermetic chips are disclosed, compatible with conventional bonding and minimum sawing processes, which produce moisture-impenetrable layers over the edge sides of the chips. The hermetic chips can then be assembled either by wire bonding or by solder bump technologies.

It is an object of the present invention to be applicable to a variety of different semiconductor assembly and packaging designs, including chips directly attached to motherboards, chips encapsulated in molded packages, chips embedded in plastic material, or chips stacked into cubes.

Another object of the present invention is to provide hermetic chips so that they support the trend towards chip-size semiconductor devices with low overall profile.

Another object of the present invention is to provide low-cost manufacturing methods so that the protective layers over the edge sides can be deposited either directly after chip singulation or at any time after removal of the chips from the singulation equipment.

Another object of the present invention is to improve product quality by process simplification, and to enhance reliability assurance by controlling thermomechanical stress and general in-process control at no extra cost.

Another object of the present invention is to introduce manufacturing concepts which are flexible so that they can be applied to many families of semiconductor products, and are general so that they can be applied to several future generations of products.

Another object of the present invention is to reach these goals while minimizing the cost of capital investment and the movement of parts and product in the equipment.

These objects have been achieved by fabrication methods suitable for mass production. The chips are singulated from the semiconductor wafer so that the edge sides are created with a single plane. Various modifications of layer depositions onto the chip edge sides have been employed.

In one embodiment of the present invention, a plurality of chips is positioned in deposition equipment with their active circuit surface facing down onto a flat substrate. Moisture-impermeable insulating material is then deposited on all area of the chip edge sides while the deposition is prevented on at least portion of the passive chip surfaces.

In another embodiment of the present invention, the semiconductor wafer is placed on a supporting substrate and separated into discrete chips. While still remaining on the substrate with their active circuit surfaces facing up, the chips are placed in deposition equipment. Moisture-impermeable insulating material is then deposited on all area of the chip edge sides while the deposition is prevented on at least portion of the active chip surfaces.

In yet another embodiment of the invention, the deposition process steps are repeated to produce a sandwich of insulating sealing films over the edge sides.

The technical advances represented by the invention, as well as the objects thereof, will become apparent from the following description of the preferred embodiments of the invention, when considered in conjunction with the accompanying drawings and the novel features set forth in the appended claims.

BRIEF DESCRIPTION OF THE DRAWINGS

FIG. 2A is a simplified and schematic view of a plurality of integrated circuit chips with protective tools in deposition equipment according to an embodiment of the invention.

FIG. 2B is a simplified and schematic view of an individual chip with a modified protective tool in deposition equipment according to another embodiment of the invention.

FIG. 2C is an enlarged view of a selected edge portion of a chip shown in FIG. 2A.

DETAILED DESCRIPTION OF THE PREFERRED EMBODIMENTS

An integrated circuit (IC), embedded in the active surface of a semiconductor chip, will provide reliable performance according to theoretical expectations during the lifetime of the device, if and when the IC is protected against deleterious influences of the environment. As defined herein, a chip is called "hermetic", when it is sealed against the ingress of environmental moisture, particulate contamination, and harmful neutral or ionic molecules.

The hermetic chips of the invention support the trend of semiconductor technology towards chip-size devices having low profile. As defined herein, the term "outline" relates to the overall width and length of the IC device, the term "profile" to the thickness or height of the IC device. In so-called "chip-size" devices, the outline of the device is the same as the outline of the IC chip, and the profile of the device is substantially similar to the profile of the IC chip.

By way of explanation, each chip, being a cuboid, exhibits six faces: The top face contains the "active surface" including the integrated circuit with its hierarchy of deposited insulating and conducting layers; the bottom face contains the "passive surface"; and the four sides around the edges, often referred to as the four "edge sides". The edge sides are preferably orthogonal to the top and the bottom faces of the cuboid, and each edge side contains preferably only a single plane.

The semiconductor chip of the invention comprises materials such as silicon, silicon germanium, gallium arsenide, or any other semiconductor material used in semiconductor device production.

Figure 1:
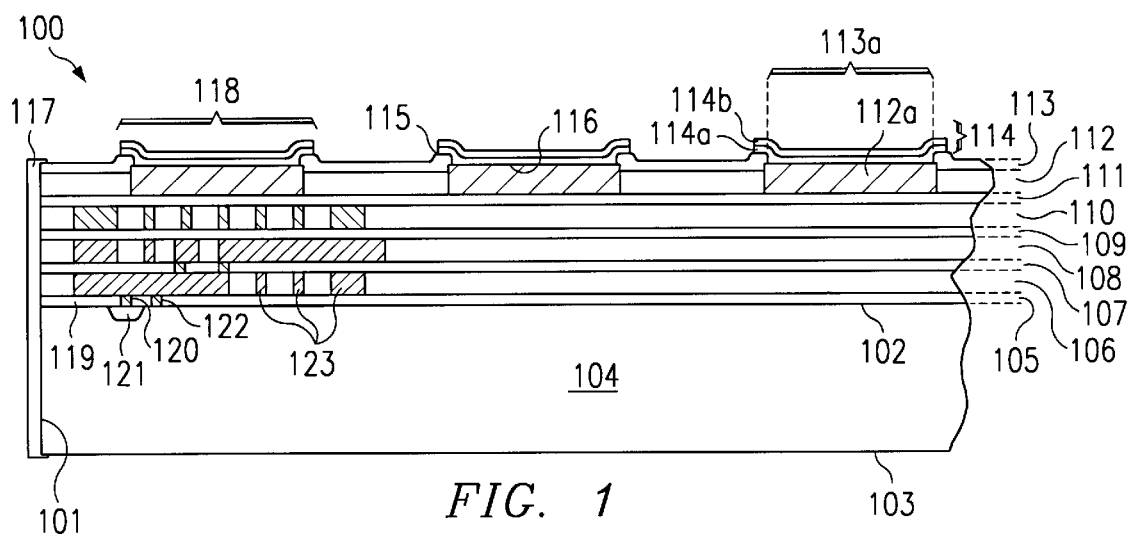
FIG. 1 is a simplified and schematic cross sectional view of a portion of a hermetic integrated circuit chip according to the invention.

FIG. 1 discloses the preferred embodiment of the invention with the integral features of a hermetic chip based on silicon substrate material. Schematically shown in FIG. 1 is a small portion of a chip, generally designated 100, including the chip edge 101 (chip thickness preferably between 200 and 375 μm) and a few examples of circuit detail. The chip edge is shown as the preferred embodiment of a single plane, orthogonal to the active surface 102 and the passive surface 103.

In the chip detail shown in FIG. 1, the integrated circuit is made over the silicon substrate 104 and its first oxide 105 (thickness typically in the 200 to 1000 nm range). The hierarchy starts with first metal level 106, which is frequently a sandwich of several metals, for instance sequentially titanium nitride 20 to 40 nm thick, copperdoped aluminum 300 to 600 nm thick, titanium nitride, 20 to 60 nm thick. It is followed by the first interlevel dielectric layer 107, which may be made of a stack of 100 to 600 nm silicon-containing hydrogen silsesquioxane (HSQ) followed by 400 to 700 nm oxide. The hierarchy is continued with second level metal 108 of similar composition as the first level metal, followed by the second interlevel dielectric layer 109, which again comprises HSQ. There is often a third (and fourth, etc.) metal level 110 and a third (and fourth, etc.) interlevel dielectric 111, before the metal level 112 for the bonding pads is reached. For the purpose of illustration, these are all shown as identical dielectric stacks, but this does not need to be so.

As defined herein, the term "hierarchy" refers to a stack of insulating and/or electrically conductive layers positioned on top of each other and processes sequentially. The layers may contain features aligned to each other.

Commonly used techniques for depositing the dielectric layers include chemical vapor deposition, sputtering, or spin-on processes. Preferred materials include silicon dioxide, silicon nitride, oxy-nitride, fluoro-silicate glass, undoped silicate glass, phosphor-silicate glass, plasma-generated tetraethylortho-silicate oxide, and recently HSQ, or even gels or a foamy substance, or an organic polymeric such as polyimide and parylene. Each material has its preferred regime for application; for instance, silicon nitrogen stops penetration by water molecules, phosphorus-doped glass offers lower reflow temperatures, HSQ exhibits very low dielectric constant. Often, however, the desirable characteristics are accompanied by undesirable ones; so are HSQ and gels structurally and mechanically weak, and polymerics may require polymerization at elevated temperatures and may be thermally unstable. The thickness of the layers can be varied widely (from 20 to 1000 nm), but is typically quite uniform across a wafer diameter.

In FIG. 1, the first essential feature for rendering chip 100 hermetic is the protective overcoat layer 113. It is made of moisture-impenetrable silicon nitride or silicon oxynitride and is commonly 200 to 1000 nm thick. It may be deposited by sputtering after the bonding pad metal has been deposited. The overcoat must be free of pinholes or cracks, but windows 113a are opened for access to the bonding pad metal.

The metal 112a for the bonding pads typically comprises 400 to 1000 nm thick copper-doped aluminum, often over a thin (10 to 200 nm) underlayer of titanium (or titanium nitride, titanium-tungsten, tantalum, tantalum nitride, tantalum silicon nitride, tungsten nitride, or tungsten silicon nitride). Recently, copper is being used as bonding pad metal, surrounded by refractory metals.

In FIG. 1, the second essential feature for rendering chip 100 hermetic is the sandwich 114 of non-corrodible metallization over the bonding pad metal. Sandwich 114, typically 400 to 1000 nm thick, consists of a layer 114a of refractory metal such as chromium, titanium, tungsten or an alloy as quoted above, and a layer 114b of bondable and solderable metal such as gold, copper, nickel, or palladium. Most important for this invention is the fact that the refractory metal forms a moisture-impermeable seal at the interface 115 to the underlying protective overcoat, as well as a low resistance ohmic contact at the interface to the contact metal 112a. The bondable and solderable metal may itself consist of a sandwich of interface metal such as nickel followed by a thin layer of noble metal such as gold, palladium or platinum (platinum shows minimal interdiffusion with solder, while palladium shows a maximum).

The protective overcoat layer 113 and the non-corrodible metal layer 114 of chip 100 are deposited and patterned while the chip is still part of the semiconductor wafer undergoing production in the wafer fabs.

In FIG. 1, the third essential feature for rendering chip 100 hermetic is the continuous sealant layer 117 which is impermeable to moisture and is overlying all area of the edge side 101, completely sealing the edge side. This sealant layer is deposited onto all four edge sides of the chip as a continuous layer, after the wafer has been separated into discrete chips (the methods of deposition according to this invention are described in more detail in FIGS. 2A, 2B and 3). The preferred material of this sealant is selected from silicon nitride, silicon oxynitride, silicon carbon alloys, moisture-impermeable polymer, and sandwiched films thereof. In order to avoid any pinholes or cracks of the sealant layer, its preferred thickness is in the range of 100 to 1000 nm. In FIGS. 2A and 2B the sealant layers around all edges of each chip are designated 210.

While the edge side 101 in FIG. 1 is preferably in a single plane, it is, in most instances, not smooth on an atomic scale, since it is created by singulation methods such as sawing or laser scribing. These methods, though, are preferred over etching techniques because of the different etch rates of the multiple insulating layers (105 through 113 in FIG. 1) deposited over the substrate material 104. The singulation step exposes not only the semiconductor substrate, but also the multiple deposited insulating layers at the edge side. In some IC devices, even metal layers are exposed, since test structures and sacrificial microcrack-stopping structures require designs with metal layers extending into the sawing line areas. Sealants made of the materials mentioned above are known to adhere reliably to all these different materials.

After the deposition of the edge side sealing layers, the contact pads 118 (with metallizations 112*a* and 114) of chip 100 in FIG. 1 may be electrically connected to interconnectors outside of the chip. Typical electrical connections are bonding wires (gold or copper), affixed by wedge or ball bonding techniques to the chip contact pads, or reflowing balls selected from a group consisting of solder, solder-coated metal, or conductive adhesive. As defined herein, the term solder "ball" does not imply that the solder contacts are necessarily spherical. They may have various forms, such as semispherical, half-dome, truncated cone, or generally bump. The exact shape is a function of the deposition technique (such as evaporation, plating, or prefabricated units) and reflow technique (such as infrared or radiant heat), and the material composition.

The interconnectors outside the chip include metallic leadframes, metal line embedded in insulating substrates, or printed circuit boards. The hermeticity conferred to the chip by the invention provides a direct chip assembly technique without the need for an additional protective package. This means that the semiconductor product being assembled is indeed of chip-size outline with minimum profile, and of minimum cost.

The invention also applies to chips designs with sacrificial metal structures embedded in the dielectric layers close to the sawing lines, and to designs having reinforcing metal structures under the bonding pads. For illustration purposes, an example of the latter design concept is depicted in FIG. 1. Portions 119 of the integrated circuit are positioned under one of the bonding pads; examples include interconnects, portions of protective structures against electrostatic discharge, precision resistors, capacitors and inductors. For electrical biasing reasons, some parts of the circuit portions may have electrical connections 120 to diffused moats 121 or other connections 122 to the semiconductor substrate. In addition, portions 123 of a reinforcing dummy structure are shown, electrically isolated from the circuit patterns.

FIG. 2A shows schematically an embodiment of the invention for the method of depositing the continuous sealant layers overlying all areas of the edge sides of IC chips. A deposition equipment, generally designated 200, comprises a flat substrate 201 and a bell jar 202 (which only symbolizes the capability to operate in controlled environment). By way of example, equipment 200 may be a sputtering or chemical vapor deposition apparatus. After having been singulated from the semiconductor wafer, a plurality of chips 203 is positioned onto the support 201 such that the active surface 203*a* of each chip faces downward towards support 201, while the passive surface 203*b* faces upward. A tool 204 of sheet-like material, preferably shaped like the IC chip, is placed onto passive chip surface 203*b* such that it covers at least portion of the passive surface. This tool may be made of a material responding to magnetic force, such as steel or magnetized material, and acts to protect at least portion of the passive surface 203*b* during the following deposition process. The counterpart for the magnetic force is fixture 205, made out of material either magnetized or responding to magnetic force; it is placed, for instance, under the support 201. The magnetic force between fixture 205 and the plurality of pieces 204 pressures the chips 203 flat against support 201 and thus prevents deposition material to reach active chip surface 203*a*.

Apparatus 200 can be operated through all process steps needed for deposition (evacuating, refilling with gas, applying voltage, controlling temperature, etc.). Using vapor deposition as the preferred process, moisture-impermeable and insulating material, such as silicon nitride or silicon carbide, is deposited onto the side edges 203 of the chips. The deposited layers are designated 210. This deposition is at a constant rate, uniform, controllable, and simultaneous onto all four edge sides of all chips in the chamber. It is, therefore, a batch production process. Dependent on the coverage of the passive surface 203*b* by tool 204, only little material is deposited onto passive surface 203*b*; substantially no material is deposited onto active surface 203*a*. Vapor deposition not only provides reliable coverage by moisture-impermeable material of the edge sides, but also of the corners of the chip where the edge sides meet the active surface at right angles. Other suitable methods include sputtering and evaporation.

For the process illustrated in FIG. 2A, the steel tools 204 may be shaped as a simple bar, strip, or cuboid. However, in another embodiment of this invention, the chips may be positioned on support 201 with their active surfaces 203*a* facing upward. In that case, the steel tools are configured to act as masks. In addition to the edge sides, the deposition would then cover those portions of the active surfaces which are not masked by the steel tools. As an example, FIG. 2B delineates the steel tool 206 in a shape needed by a low pin-count chip with few circuit contact pads to be protected. In that case, the steel tool needs to mask these circuit contact pads and possibly some selected other areas of the active chip surface 203*a*; consequently, it may have the shape of a center spine supporting fishbone-like structures of side bars having a width sufficient to cover the circuit contact pads.

In the embodiment of FIG. 2B, as well as in the embodiment of FIG. 2A, it is important for cost-effective mass production to employ deposition equipment suitable for batch processing of individual chips, preferably operated by robots minimizing non-value-adding queue times.

After the deposition of the sealant layer over the edge sides, thermo-mechanical stress between the layer and the chip may be relieved by excursions to elevated temperatures (for instance, between 50 and 150° C.) for several minutes, followed by slow cooling.

Figure 3:
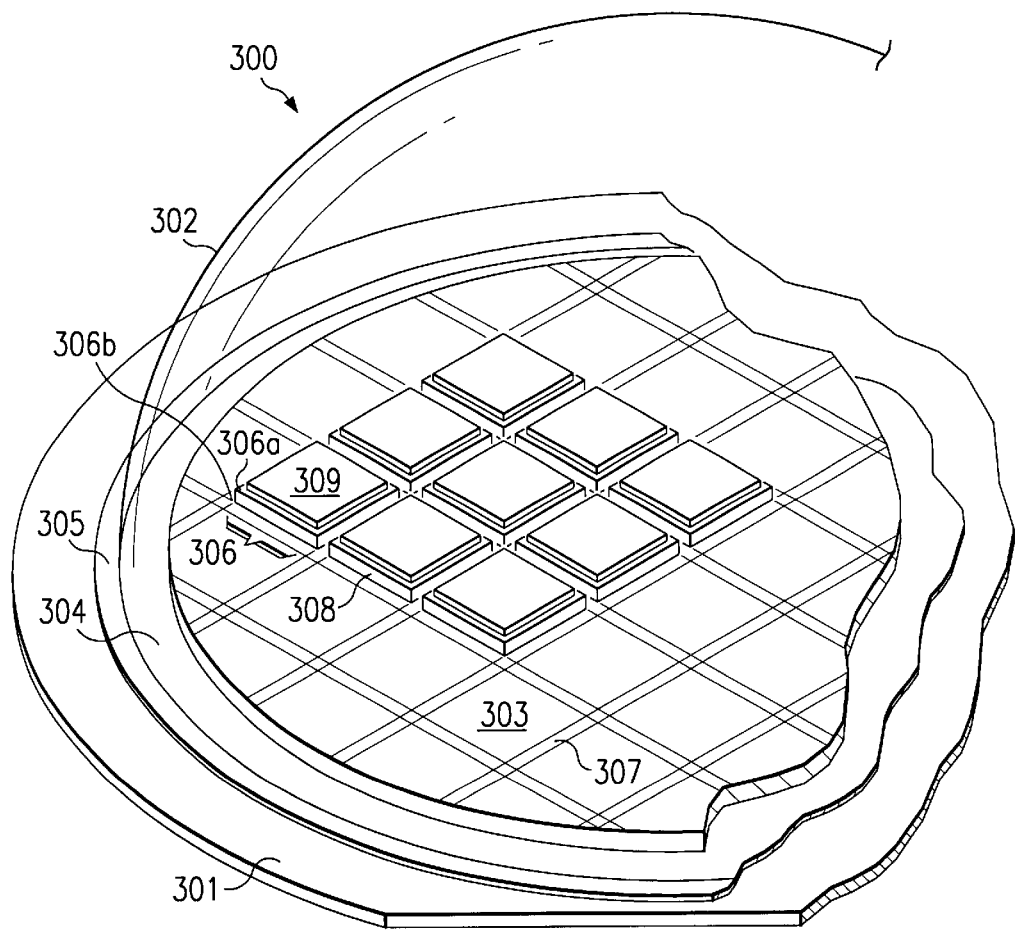
FIG. 3 is a simplified and schematic view of a portion of a semiconductor wafer, singulated into individual chips, in deposition equipment according to another embodiment of the invention.

FIG. 3 shows schematically another embodiment of the invention for the method of depositing the continuous sealant layers overlying all areas of the edge sides of IC chips. A deposition equipment, generally designated 300, comprises a flat fixture 301, which reacts to magnetic force or is magnetized, and a bell jar 302 (which only symbolizes the capability to operate in controlled environment). By way of example, equipment 300 may be a sputtering or a chemical vapor deposition apparatus; sputtering is the preferred process, because it operates at lower temperatures. At least one whole semiconductor wafer 303, or portions of semiconductor wafers, can be placed in this equipment. The wafer, or the wafer portions, have an active and a passive surface. A plurality of integrated circuits is embedded into the active surface, with their multiple deposited layers, a moisture-impermeable protective overcoat, and a plurality of contact pads with bondable and non-corrodible surface. The wafer, or the wafer portions, are positioned with their passive surfaces on a plastic film support 304 held tight by metal frame 305.

FIG. 3 indicates that the semiconductor wafer 303, while positioned on plastic film support 304, has been separated into a plurality of individual IC chips 306. Typically, this separation is performed by precision sawing; other methods include cutting by laser or water jet. In FIG. 3, the sawing streets 307 indicate the grid of separating cuts. In the course of the separation process, grooves are formed into the semiconductor wafer which extend from the active surface 306a to the passive surface 306b, and create the edge sides 308 (four edge sides per chip). The grooves expose the semiconductor substrate as well as portions of the layers which had been deposited onto the semiconductor substrate during the integrated circuit fabrication processes. Due to the chip separation process, each edge side 308 of a chip has only a single plane, but is usually not smooth on an atomic scale.

After the chip separation step, wafer 303 on support film 304 is placed in the deposition equipment, which preferably is a sputtering apparatus. Tools 309 of sheet-like material, preferably shaped like the IC chip, are placed onto the active chip surfaces 306b such that they cover most of the area of the active surface, or at least the chip contact pads. These tools may be made of material responding to magnetic force, such as steel or magnetized material; they form the counterpart to magnetized fixture 301. While tools 309 preferably have an area comparable to the IC area, they may also be shaped as masks similar to the example described in FIG. 2B, covering at least the chip contact pads. The precise positioning onto the chips of tools 309 is preferably performed by robots enhancing mass production throughput.

Apparatus 300 can be operated through all process steps needed for deposition, especially sputtering. Moisture-impermeable and insulating material, such as silicon nitride or silicon carbide, is deposited onto the edge sides 308 of all chips in the apparatus. The deposition is at a constant rate, uniform, controllable, and results in layers free of pinholes or cracks. It is a batch production process. Dependent on the size and shape of tools 309 and their coverage of the active surfaces 306a, only little if any material is deposited onto active surfaces 306a; the corners of the chips where the edge sides meet the active surfaces at right angles, are reliably covered. Substantially no material is deposited onto passive surfaces 306b. Other suitable deposition methods include evaporation and chemical vapor deposition.

After the deposition of the sealant layer over the edge sides, thermo-mechanical stress between the layer and the chip may be relieved by excursions to elevated temperatures (for instance between 50 and 150° C.) for several minutes, followed by slow cooling.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

We claim:

1. A semiconductor device comprising:
    a semiconductor chip having an active and a passive surface and four edge sides, each edge side having substantially only a single plane;
    said active surface having an integrated circuit including multiple deposited layers and a plurality of contact pads, said contact pads having bondable and non-corrodible surfaces;
    said deposited layers having exposed portions at said edge sides;
    a protective overcoat impermeable to moisture overlying said integrated circuit; and
    a continuous sealant layer impermeable to moisture overlying all areas of said four edge sides, whereby said edge sides are sealed and said chip is rendered entirely hermetic.

2. The semiconductor device according to claim 1 wherein said protective overcoat is selected from a group consisting of silicon nitride, silicon oxynitride, silicon carbon alloys, and sandwiched films thereof.

3. The semiconductor device according to claim 1 wherein said sealant layer is selected from a group consisting of silicon nitride, silicon oxynitride, silicon carbon alloys, moisture-impermeable polymer, and sandwiched films thereof.

4. The semiconductor device according to claim 1 wherein said non-corrodible metallization comprises a noble metal disposed over a refractory metal.

5. The semiconductor device according to claim 4 wherein said noble metal comprises palladium, gold, platinum, silver, or alloys thereof.

6. The semiconductor device according to claim 4 wherein said refractory metal comprises tungsten, titanium, titanium nitride, molybdenum, chromium, or alloys thereof.

7. The semiconductor device according to claim 6 wherein said refractory metal forms a moisture-impermeable seal with said protective overcoat.

8. The semiconductor device according to claim 1 further comprising means for electrically connecting said contact pads to interconnectors outside of said chip.

9. The semiconductor device according to claim 8 wherein said means of connecting comprise bonding wires.

10. The semiconductor device according to claim 8 wherein said means of connecting are balls selected from a group consisting of solder, solder-coated metal, and conductive adhesive.

11. The semiconductor device according to claim 8 wherein said interconnectors outside said chip are metallic leadframes, metal lines embedded in insulating substrates, or printed circuit boards.

12. The semiconductor device according to claim 1 wherein said semiconductor chip comprises silicon, silicon germanium, gallium arsenide, or any other semiconductor material used in electronic device production.

* * * * *